United States Patent
Joblot et al.

(10) Patent No.: US 9,455,191 B2
(45) Date of Patent: Sep. 27, 2016

(54) SHIELDED COPLANAR LINE

(71) Applicant: STMicroelectronics SA, Montrouge (FR)

(72) Inventors: Sylvain Joblot, Bizonnes (FR); Pierre Bar, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/074,130

(22) Filed: Mar. 18, 2016

(65) Prior Publication Data
US 2016/0204031 A1    Jul. 14, 2016

Related U.S. Application Data

(62) Division of application No. 13/899,326, filed on May 21, 2013, now Pat. No. 9,324,612.

(30) Foreign Application Priority Data

May 24, 2012   (FR) ..................................... 12 54786

(51) Int. Cl.
*H01L 21/44*     (2006.01)
*H01L 21/311*    (2006.01)
(Continued)

(52) U.S. Cl.
CPC ... *H01L 21/76898* (2013.01); *H01L 21/76831* (2013.01); *H01L 23/528* (2013.01);
(Continued)

(58) Field of Classification Search
CPC ....... H01L 21/44; H01L 21/30; H01L 21/31; H01L 21/47; H01L 21/46; H01L 21/76; H01L 23/48; H01L 23/52; H01L 23/66; H01L 23/53

USPC ....... 438/629, 637, 639, 640, 667, 668, 672, 438/675, 700, 701, 713, 978; 257/770–774
See application file for complete search history.

(56) References Cited

U.S. PATENT DOCUMENTS

| | | |
|---|---|---|
| 6,674,347 B1 | 1/2004 | Maruhashi et al. |
| 8,153,520 B1 | 4/2012 | Chandrashekar et al. |

(Continued)

FOREIGN PATENT DOCUMENTS

| | | |
|---|---|---|
| EP | 1 978 531 A1 | 10/2008 |
| WO | 2004/051746 A1 | 6/2004 |

OTHER PUBLICATIONS

Reyes et al., "Silicon as a Microwave Substrate," *IEEE MTT-S International Microwave Symposium Digest* 3:1759-1762, May 23-27, 1994, 1 page. (Abstract only).

*Primary Examiner* — Jessica Stultz
*Assistant Examiner* — Sheikh Maruf
(74) *Attorney, Agent, or Firm* — Seed IP Law Group PLLC

(57) ABSTRACT

In one embodiment there is disclosed a method for manufacturing an integrated circuit in a semiconductor substrate including through vias and a coplanar line, including the steps of: forming active components and a set of front metallization levels; simultaneously etching from the rear surface of the substrate a through via hole and a trench crossing the substrate through at least 50% of its height; coating with a conductive material the walls and the bottom of the hole and of the trench; and filling the hole and the trench with an insulating filling material; and forming a coplanar line extending on the rear surface of the substrate, in front of the trench and parallel thereto, so that the lateral conductors of the coplanar line are electrically connected to the conductive material coating the walls of the trench.

19 Claims, 4 Drawing Sheets

(51) Int. Cl.
  *H01L 21/768* (2006.01)
  *H01L 23/66* (2006.01)
  *H01L 23/528* (2006.01)
  *H01L 23/532* (2006.01)

(52) U.S. Cl.
  CPC ..... *H01L23/5329* (2013.01); *H01L 23/53228* (2013.01); *H01L 23/66* (2013.01); *H01L 2223/6616* (2013.01); *H01L 2223/6627* (2013.01)

(56) References Cited

U.S. PATENT DOCUMENTS

| | | |
|---|---|---|
| 2004/0041653 A1 | 3/2004 | Tanabe et al. |
| 2004/0070080 A1 | 4/2004 | Pendse |
| 2004/0174228 A1 | 9/2004 | Kanno |
| 2005/0248421 A1 | 11/2005 | Joodaki |
| 2007/0086147 A1 | 4/2007 | Kawamura et al. |
| 2007/0256858 A1 | 11/2007 | Kariya et al. |
| 2008/0079636 A1* | 4/2008 | Mohamadi ............. H01L 23/66 343/700 MS |
| 2009/0038830 A1 | 2/2009 | Tanaka et al. |
| 2009/0057823 A1 | 3/2009 | Ching et al. |
| 2009/0267713 A1 | 10/2009 | Ohhira |
| 2010/0032811 A1* | 2/2010 | Ding ................... H01L 21/6835 257/621 |
| 2010/0041226 A1 | 2/2010 | Reid et al. |
| 2010/0307798 A1* | 12/2010 | Izadian ................... H01L 24/24 174/255 |
| 2011/0128099 A1 | 6/2011 | Weiss |
| 2011/0207323 A1* | 8/2011 | Ditizio ................ B81C 1/00087 438/675 |
| 2011/0284386 A1 | 11/2011 | Willey et al. |
| 2012/0013019 A1* | 1/2012 | Sakamoto ........... H01L 23/5225 257/774 |
| 2012/0205806 A1* | 8/2012 | Yelehanka ........ H01L 21/76898 257/751 |
| 2012/0256318 A1* | 10/2012 | Sawada ............... H01L 25/0657 257/773 |
| 2012/0270404 A1* | 10/2012 | Bajaj ................. H01L 21/76898 438/700 |
| 2012/0308177 A1* | 12/2012 | Joblot ............... H01L 21/76898 385/14 |
| 2013/0026606 A1 | 1/2013 | Farooq et al. |
| 2013/0109176 A1* | 5/2013 | Blaschke ............. H01L 21/743 438/675 |
| 2013/0249096 A1* | 9/2013 | Eissa ................ H01L 21/76898 257/751 |
| 2015/0014859 A1* | 1/2015 | Dutta .................... H01L 23/473 257/774 |

* cited by examiner

SHIELDED COPLANAR LINE

BACKGROUND

1. Technical Field

The present disclosure relates to a method for forming coplanar waveguides in a radio frequency integrated circuit, and more specifically to a method for forming shielded coplanar waveguides.

2. Description of the Related Art

Coplanar waveguides (CPW), or more simply coplanar lines, are currently used in radio frequency integrated circuits (RF), to convey high-frequency signals between two elements of the circuit, for example, between an output amplifier and an antenna. Such lines are particularly current in applications using frequencies ranging from 300 MHz to a few hundreds of GHz.

FIGS. 1 and 2 respectively illustrate in cross-section view and in top view the structure of such a coplanar line. An integrated circuit 1 comprises a semiconductor substrate 2, having active components formed on one of its surfaces. The substrate is topped with an insulating layer 3 in which a coplanar line has been formed. This line comprises a conductive track 4, forming the central conductor and intended to receive the RF signal, surrounded with symmetrical parallel conductive tracks 5 and 6 located in the same plane as track 4, and forming the ground.

Such a coplanar line has a high attenuation coefficient, due to the capacitive coupling between the conductive tracks of the line and the semiconductor substrate and due to the conductivity of this substrate.

FIG. 3 shows the simplified equivalent electric diagram of a coplanar line arranged above a semiconductor substrate of an integrated circuit (the specific inductive and resistive components of the line have deliberately been omitted), as well as three characteristic dimensional parameters, that is, width w of central conductive track 4, spacing g between this track and ground tracks 5 and 6, and thickness h of dielectric 3 separating conductive tracks 4, 5, and 6 from substrate 2. Central conductive track 4 is capacitively coupled by its sides with ground tracks 5 and 6, which coupling is symbolized by capacitors 7 and 8. Further, the three tracks 4, 5, and 6 have a capacitive coupling with semiconductor substrate 2, respectively symbolized by capacitors 9, 10, and 11. Due to the substrate conductivity, there is a resistive coupling between central conductor 4 and lateral conductors 5 and 6, symbolized by resistors 12, through capacitors 9, 10, and 11. Such a coplanar line has a high attenuation coefficient, which limits its transmission performance.

The sizing of such a coplanar line, for a given usage frequency, results from a numbers of constraints. The targeted characteristic impedance, typically 50 ohms, height h of dielectric 3 between the tracks and substrate 2, as well as the relative permittivity of this dielectric, altogether set ratio w/g of the width of central conductor 4 to its spacing from lateral conductors 5 and 6. The resistivity of the conductive material forming the central conductor and the lateral conductors, typically formed of copper, sets the minimum width w of the central conductor, and thus spacing g. The width of lateral conductors 5 and 6, which are conventionally from 2 to 3 times wider than the central conductor, is thus also determined. This results in a total width of the line, which in turn determines the amplitude of the capacitive coupling with the substrate and of the resistive loss due to the substrate conductivity. It is thus not possible to decrease the attenuation coefficient of a coplanar line by only varying the dimensions of the elements forming it.

To reduce the attenuation coefficient of a coplanar line integrated on a semiconductor substrate, it has been provided (Reyes et al, IEEE Microwave Symposium Digest MTT-S International 1994, 1759-1762) to decrease the resistive loss by using a high-resistivity substrate. This solution however has several disadvantages. Such substrates are currently typically ten times more expensive than standard silicon substrates and they typically involve adapting the active component manufacturing steps, which increases integrated circuit manufacturing costs. Besides, there remains in the semiconductor substrate, close to the interface with dielectric 3, a layer having a much higher conductivity than the substrate, due to the presence of charges trapped in the dielectric. It is in practice difficult to avoid the occurrence of such charges and thus to improve the attenuation coefficient of a coplanar line integrated on silicon, even by using a high-resistivity substrate.

The loss due to the substrate can be partly minimized by providing a maximum distance between the line and the substrate, as illustrated in FIG. 4. This drawing shows an integrated circuit 1 comprising a semiconductor substrate 2 coated with a set of metallization levels M1 to M6, which set is currently called BEOL, for Back End Of Line. Such metallization levels conventionally comprise thinner lower metallization levels M1 to M4 and thicker upper metallization levels M5 and M6. Each level comprises conductive tracks 15 and vias 16 connecting conductive tracks 15 to the conductive tracks of the metallization level located immediately underneath. Central conductor 4 and lateral conductors 5 and 6 of a coplanar line have been formed in tracks of upper metallization level M6. The thicknesses, on the one hand, of the insulating layers separating upper metallization levels M5 and M6 and separating levels M4 and M5, on the other hand, from the conductive tracks of upper metallization levels M5 and M6, have been increased with respect to a stack of metallizations of a standard integrated circuit, to maximize total height h of dielectric 3, between substrate 2 and the coplanar line. However, such an approach is limited by current methods for forming metallization levels and does not enable to much exceed thicknesses h of 10 μm. The number of metallization levels may also be increased to increase height h, but this increases the complexity and the cost of the integrated circuit.

It should further be noted that a coplanar line formed on an integrated circuit is a source of electromagnetic radiation capable of creating parasitic signals, in the conductive tracks or the neighboring transistors. It is thus desirable to form a shielding structure around such a line, an embodiment thereof being illustrated in FIG. 4. Stacks of conductive tracks and vias belonging to metallization levels M1 to M5 and forming a Faraday cage around the coplanar line and the insulator as well the adjacent devices have been shown, under the ground tracks and at the periphery thereof. A continuous ground plane, or shielding plane 18, formed in the lower metallization level and forming the bottom of the Faraday cage has also been shown. Such a conductive plane, in front of central conductor 4, however strongly increases the resistive loss and thus increases the attenuation coefficient of the coplanar line.

It should finally be noted that the coplanar lines described hereabove are structure of large bulk, given the submicronic size of current transistors and the tendency to miniaturize circuits. Such lines indeed currently have widths greater than 50 μm and lengths of several millimeters. To decrease the surface of active areas dedicated to these lines, it has been provided to form them on the rear surface of integrated circuits and to connect them to the front surface active components by through conductive connections, currently called TSVs (Through Silicon Vias). Such lines are then formed in a portion of the conductive tracks formed on the rear surface and currently called RDLs (Re-Distribution Layers).

The coplanar lines formed on the rear surface of an integrated circuit however have the same disadvantages as those formed at the front surface, in terms of loss due to the substrate conductivity. Further, since the number of metallization levels is generally smaller at the rear surface (RDL) than at the front surface (BEOL), it is more difficult to provide as large a distance from the line to the substrate as at the front surface.

BRIEF SUMMARY

One embodiment of the present disclosure is a low-cost method for manufacturing shielded coplanar lines on the rear surface of an integrated circuit, with a low attenuation coefficient.

An embodiment provides a method for manufacturing an integrated circuit in a semiconductor substrate comprising through vias and a coplanar line, comprising the steps of:

a) forming, on top and inside of the front surface of a semiconductor substrate, active components and a set of front metallization levels comprising conductive portions formed in insulating portions;

b) simultaneously etching from the rear surface of the substrate a first through via hole and a second hole crossing the substrate through at least 50% of its height;

c) coating with a conductive material the walls and the bottom of the first hole and of the second hole; and d) filling the first and second holes with an insulating filling material; and e) forming a coplanar line extending on the rear surface of the substrate, in front of the second hole and parallel thereto, so that the lateral conductors of the coplanar line are electrically connected to the conductive material coating the walls of the second hole.

According to an embodiment, the central conductor of the coplanar line is formed in front of said insulating filling material, and the width of this central conductor is smaller than the width of the second hole.

According to an embodiment, before step c), the following steps are carried out:

coating with an insulating layer the rear surface of the substrate, the walls, and the bottom of the first and second holes; and removing said insulating layer from the bottom of the first hole.

According to an embodiment, the second hole thoroughly crosses the substrate and emerges into an insulating portion of said set of front metallization levels.

According to an embodiment, at least two rear metallization levels are formed on the rear surface of the substrate, the first one being formed during step c).

According to an embodiment, the lateral conductors of the coplanar line are formed in the first rear metallization level and the central conductor of the coplanar line is formed in an upper level of the rear metallization level.

According to an embodiment, the central conductor and the lateral conductors of the coplanar line are formed in an upper level of the rear metallization level.

According to an embodiment, the conductive material contains copper.

According to an embodiment, the insulating material is a polymer of small electric permittivity.

An embodiment provides an integrated circuit comprising on a rear surface of a semiconductor substrate a coplanar line formed in front of and parallel to a second hole formed in said surface and crossing the substrate through approximately 50% of its height, wherein the walls and the bottom of the second hole are lined with a conductive material and the second hole is filled with an insulating filling material, and wherein the lateral conductors of the coplanar line are electrically connected to said conductive material lining the second hole walls.

According to an embodiment, the central conductor of the coplanar line is formed in front of said insulating filling material, and the width of this central conductor is smaller than the width of the second hole.

According to an embodiment, the second hole thoroughly crosses the substrate.

According to an embodiment, an insulating layer is arranged in the second hole and on the rear surface, between the substrate and the conductive material.

The foregoing and other features and advantages will be discussed in detail in the following non-limiting description of specific embodiments in connection with the accompanying drawings.

DETAILED DESCRIPTION

Figure 1:
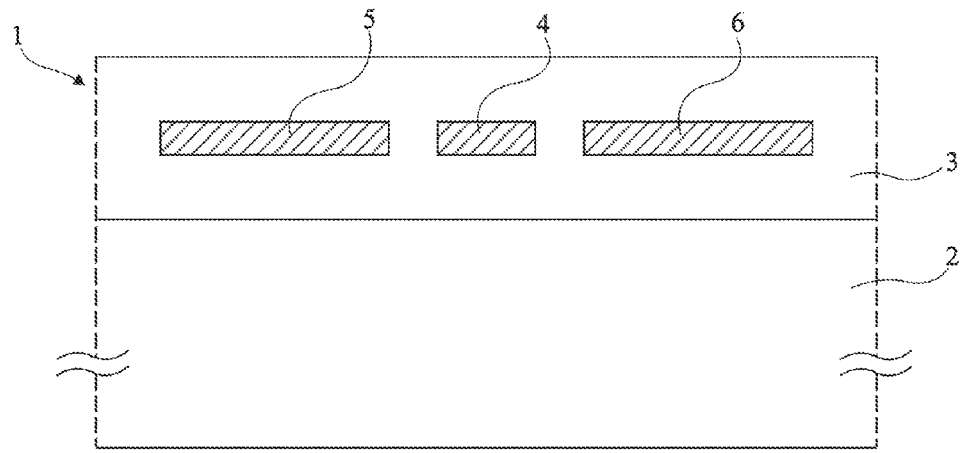
FIG. 1 and FIG. 2, previously described, respectively are cross-section and top views of an integrated circuit comprising a coplanar line.
Figure 2:
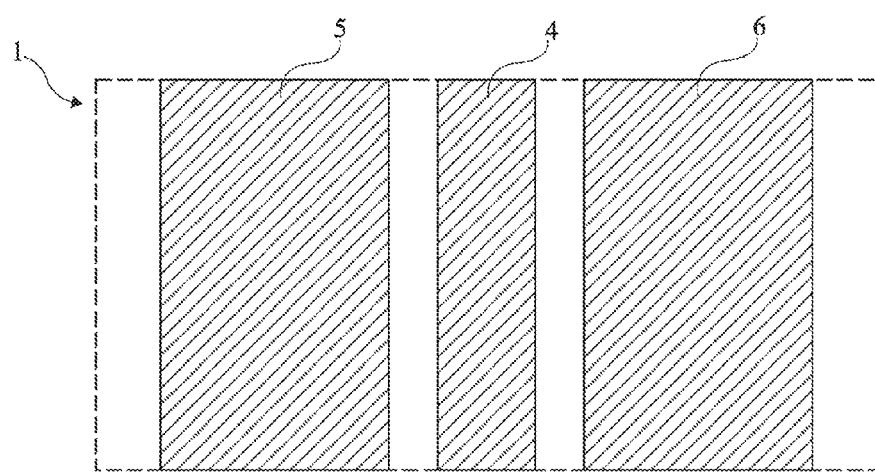

For clarity, the same elements have been designated with the same reference numerals in the different drawings and, further, as usual in the representation of integrated circuits, the various drawings are not to scale.

Figure 5A:
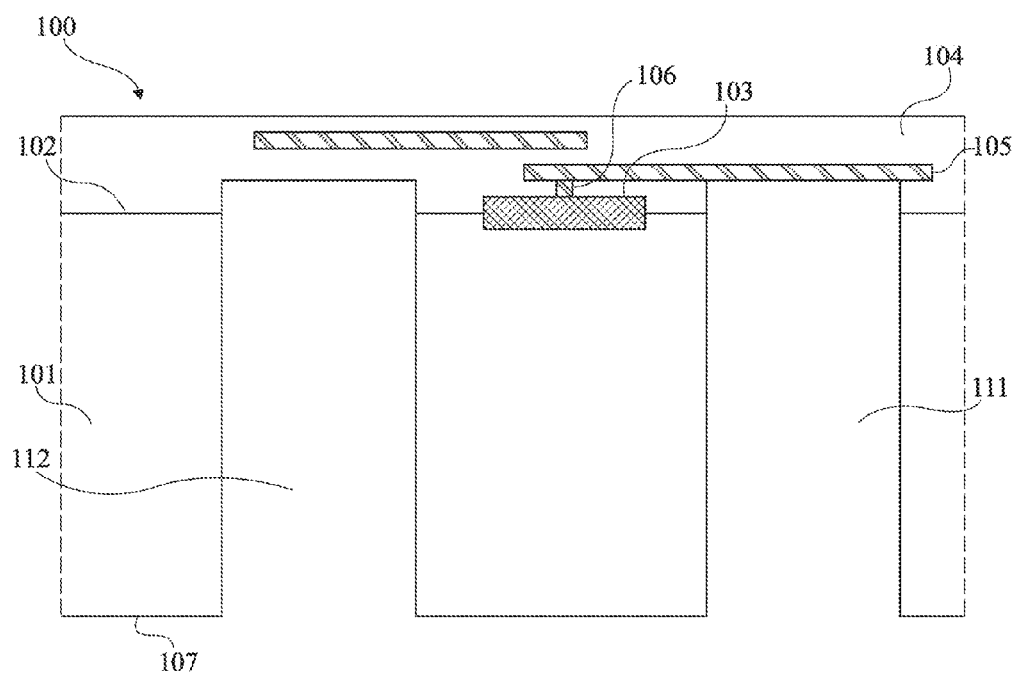
FIGS. 5A to 5C are cross-section views illustrating steps of the manufacturing of an embodiment of a coplanar line.
Figure 5B:
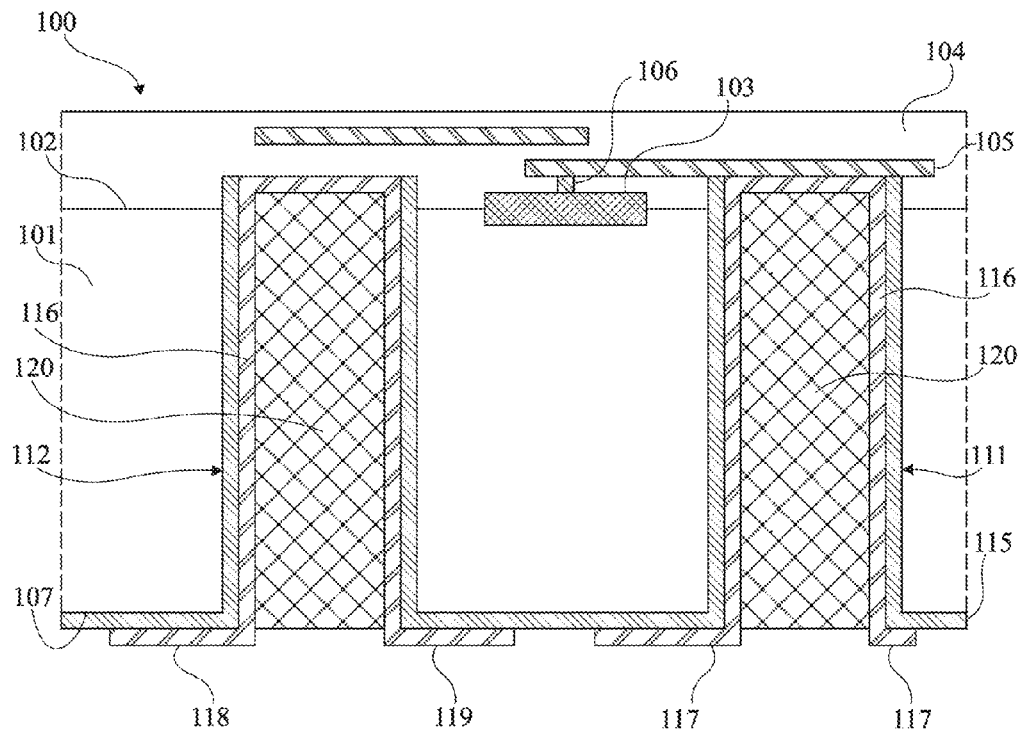
Figure 5C:
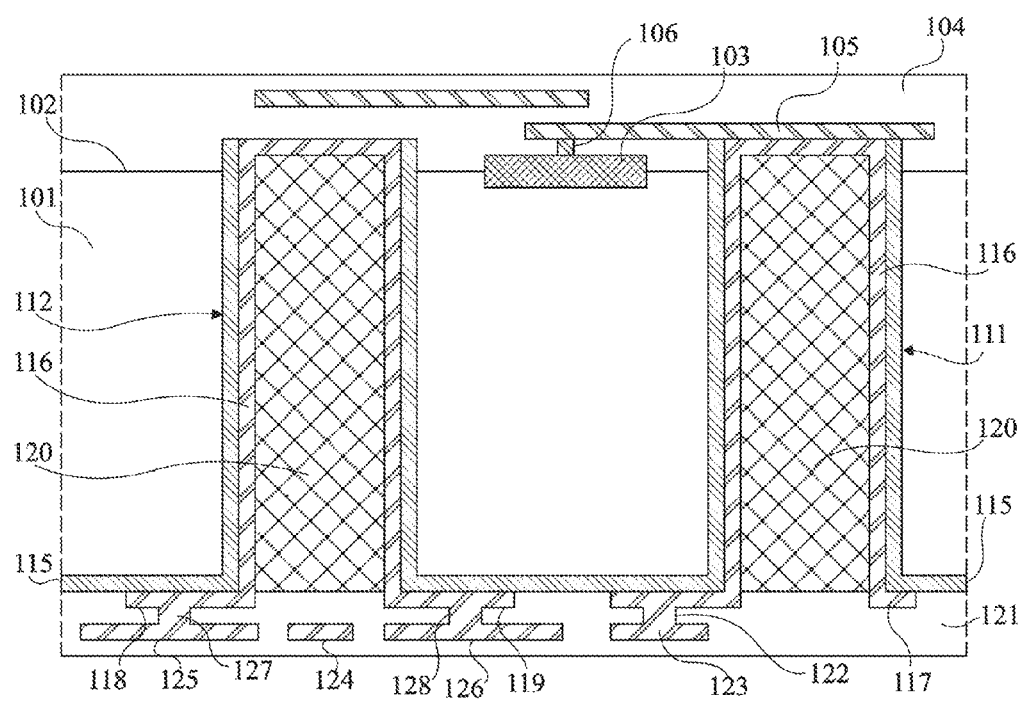

FIGS. 5A to 5C are cross-section views of an integrated circuit 100 illustrating steps of the manufacturing of an embodiment of an integrated circuit 100 comprising a line.

At the step illustrated in FIG. 5A, the integrated circuit comprises a semiconductor substrate 101, on top and inside of front surface 102 of which active components 103, for example, transistors, have been formed. Front surface 102 is coated with a set of front metallization levels, comprising conductive portions, for example, made of copper, formed in insulating portion 104, for example, made of silicon oxide and of silicon nitride. This set of metallization levels comprises a first metallization level 105, electrically connected to active components 103 by a contact 106. Substrate 101 has been thinned to have a thickness ranging from 50 to 300 µm.

Substrate 101 has been etched from its rear surface 107 to form a first hole 111 and a trench or second hole 112, shown in cross-section view. The first 111 has a diameter for example from 2 to 3 times smaller than the thickness of thinned substrate 101. Second hole 112 has a width substantially equal to that of the first hole and extends substantially throughout the height of the coplanar line to be formed. In this example, first hole 111 and second hole 112 thoroughly cross the substrate to reach front surface 102 of the semiconductor substrate in areas having no active components. The etching has then been continued and a portion of insulating layer 104 covering the front surface of the substrate has been removed, so that first hole 111 emerges on a conductive portion 105 of the first metallization level. Second hole 112 emerges into a portion of insulating layer 104 comprising no conductive element. According to a variation, second hole 112 may also emerge on a conductive portion of metallization level 105.

At the step illustrated in FIG. 5B, a layer 115 of insulating material, for example, a layer of 1 μm of silicon oxide, is deposited on rear surface 107 of the substrate. This layer is then etched from the bottom of the hole but is kept on the hole walls, as well as on rear surface 107. Then, a layer 116 of a conductive material, for example, a 3-μm layer of electrodeposited copper, has been deposited on rear surface 107 of the substrate, on the walls and at the bottom of second hole 112 and on the walls and at the bottom of first hole 111. The deposition of conductive layer 116 may comprise, before the electrodeposition step, the deposition of a diffusion barrier layer and of a bonding layer.

Conductive layer 116 has then been etched on rear surface 107 of the substrate, to form a first rear metallization level. A portion of layer 116 has been kept around first hole 111 to form a skirt 117. Conductive layer 116 lining the walls of first hole 111 is in contact with conductive portion 105 of the front metallization level and skirt 117 of the rear metallization network, and thus forms an electrically conductive through connection (TSV). A portion of layer 116 has also been kept on either side of second hole 112, to form two conductive tracks 118 and 119, symmetrical and parallel to second hole 112.

First hole 111 and second hole 112 have finally been filled with an insulating material 120 of small electric permittivity, for example, a polymer of polysiloxane type, such as SiNR, deposited on the rear surface of the substrate, for example, by cold rolling, or by spin coating, and then cross-linked.

In FIG. 5C, a second rear metallization level comprising, in an insulating layer 121, conductive tracks 123 connected to the conductive tracks of the first metallization level by vias 122, has been formed on the rear surface of the substrate. This second metallization level comprises, above second hole 112, a conductive track 124, surrounded with parallel symmetrical conductive tracks 125 and 126, respectively forming the central conductor and the lateral conductors of the coplanar line. Lateral tracks 125 and 126 are electrically connected, by vias 127 and 128, to tracks 118 and 119 arranged on either side of second hole 112. Central track 124 is arranged above second hole 112. According to an alternative embodiment, insulating layer 121 may comprise a portion of insulating material 120 which has been used to fill first hole 111 and second hole 112, which will have been kept on the rear surface of the substrate.

Conductive track 116, coating the bottom and the walls of the second hole and forming tracks 118 and 119 contiguous to the second hole, vias 127 and 128, and lateral ground tracks 125 and 126, are electrically grounded and form a full electromagnetic shielding of line 124 from the substrate and the active components formed on its surface, but also from the conductive tracks of the rear metallization levels.

Figure 3:
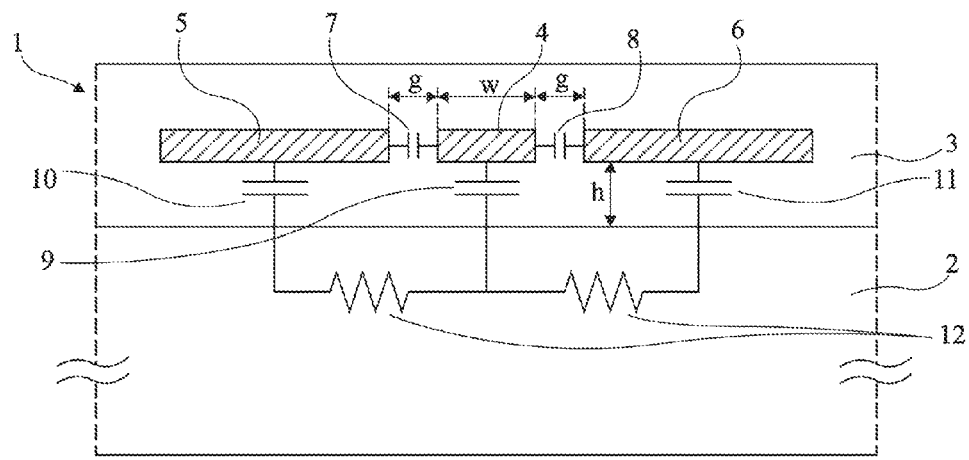
FIG. 3, previously described, is a cross-section view of the coplanar line of FIG. 1, and illustrates its equivalent electric diagram.
Figure 4:
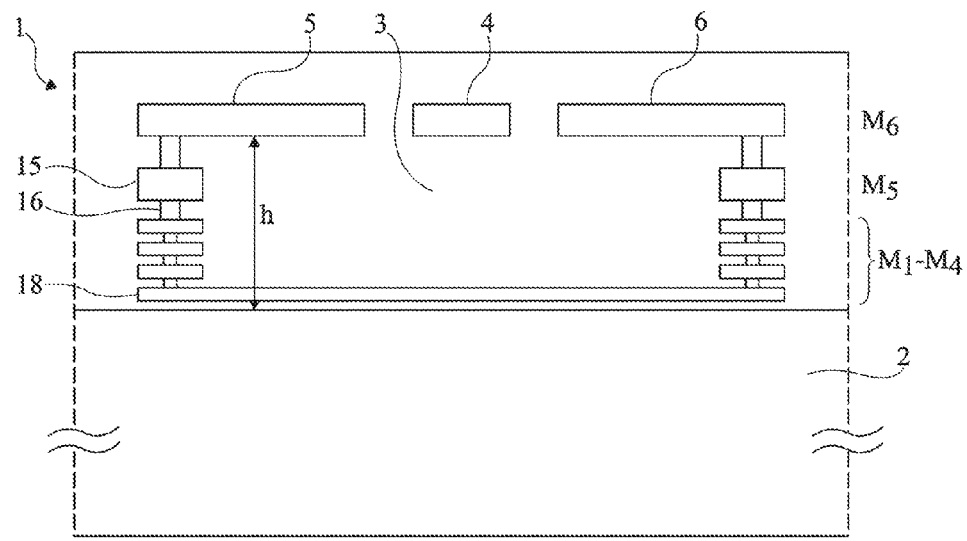
FIG. 4, previously described, is a cross-section view of an integrated circuit comprising a coplanar line.

The central conductor of the coplanar line located above a hole which is both deep (>50 μm) and of a width comparable to the conductor width, this hole being filled with a dielectric of low permittivity, such a line suppresses transmission losses of the type illustrated in FIG. 3. The present inventors have measured, for such a line formed on a silicon substrate of standard resistivity (15 ohms-cm), an attenuation coefficient of 0.26 dB/mm, that is, two times smaller than that measured for a conventional coplanar line formed on a silicon substrate of high resistivity.

Figure 6:
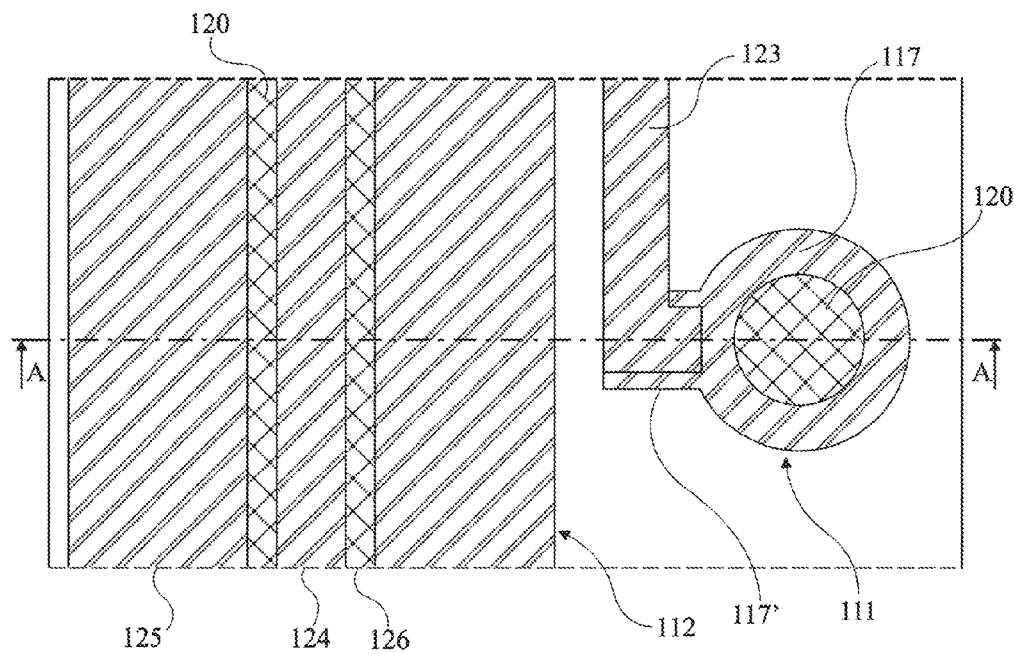
FIG. 6 is a top view of the coplanar structure of FIG. 5C.

FIG. 6 is a bottom view of the circuit 5C, illustrating an example of layout of through via in first hole 111 and of the coplanar line above second hole 112. Central conductive track 124 of the coplanar line, arranged above dielectric material 120 for filling the second hole, and surrounded on both sides with lateral ground tracks 125 and 126, has been shown to the left of the drawing. Metallized first hole 111 forming a through connection, provided with its skirt 117 and filled with filling material 120 has been shown to the right of the drawing. As shown, skirt 117 comprises an extension 117' having track 123 connected thereto by a via 122 not shown.

Figure 7:
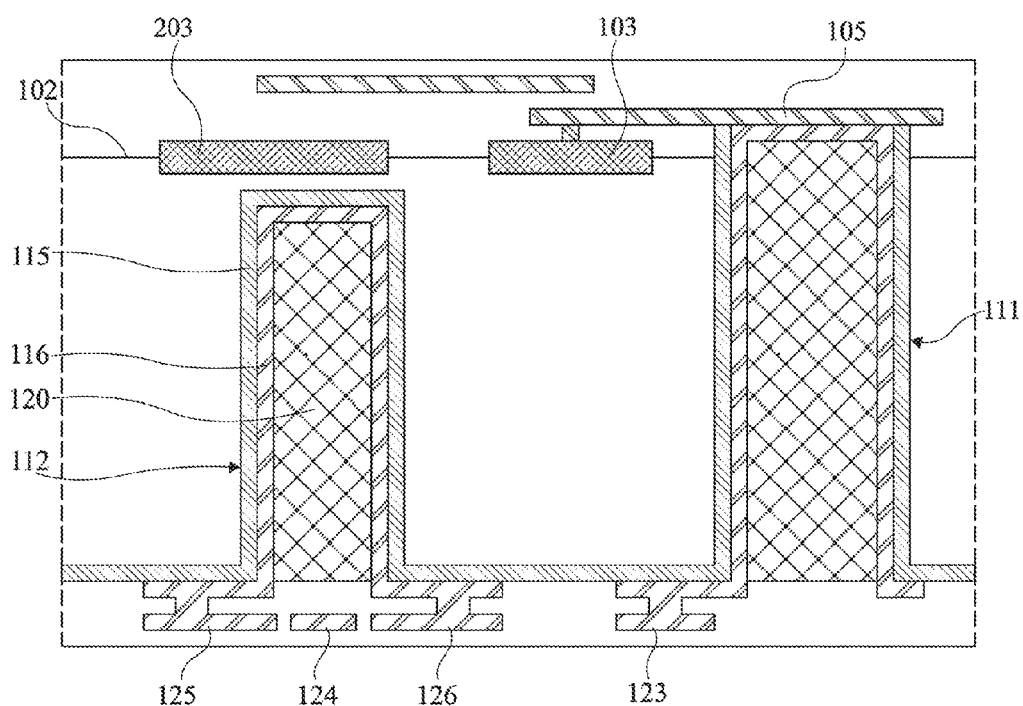
FIG. 7 is a cross-section view illustrating an alternative embodiment of a coplanar line.

FIG. 7 is a cross-section view of an integrated circuit illustrating an alternative embodiment of a coplanar line such as described hereabove. In this variation, the second hole forming the shielding of the coplanar line does not thoroughly cross the substrate and it can thus be provided to form active components 203 in the upper surface portion of the substrate located above the second hole. Such a modification of the second hole depth may be obtained with no modification of the coplanar line manufacturing steps, by simply adjusting the second hole width.

It is indeed known that with most etch methods used to etch holes and deep trenches, and especially those currently called RIE (for Reactive Ion Etching), the etch speed is a function of the width of the openings, narrow openings etching slower than wider openings. By taking advantage of this effect, it is possible to select a smaller width for second hole 112 than for first hole 111, so that by adapting the etch time, first hole 111 emerges into conductive track 105 of the first front metallization level while there remains from 5 to 10 μm of semiconductor substrate between the bottom of second hole 112 and upper surface 102 of the substrate, which enables to form active components therein.

The coplanar lines which have just been described in relation with FIGS. 5 to 7 have been formed by using the same manufacturing steps as those used to form through connections in first hole 111 and the metallization levels on the rear surface of the integrated circuit, that is, by a simple and inexpensive method.

Central conductor 124 is formed in front of a second hole 112 having a width much greater than its own width. This second hole is filled with a dielectric material 120 of low permittivity, which suppresses any resistive loss due to the substrate and provides a very low attenuation coefficient.

Conductive layer 116 coating the second hole walls and forming lateral tracks 118 and 119 forms, with lateral conductors 125 and 126 to which it is electrically connected by vias 127 and 128, an electromagnetic shielding of line 124 from the active components and the conductive tracks formed on the front surface side of the substrate, as well as from the adjacent conductive tracks formed on the rear surface of the substrate.

Specific embodiments of the present disclosure have been described. Various alterations and modifications will occur to those skilled in the art. In particular, a filling of the vias and holes with a polymer material has been described. Any other adequate material would be possible. It is also possible to form the coplanar line without forming conductive tracks 125 and 126, conductive tracks 118 and 119 playing the role of lateral conductors of the line. This is possible if filling material 120 is depressed with respect to the rear surface of the substrate, so that conductor 124, formed in the second rear metallization level, is substantially in the plane of conductive tracks 118 and 119 running alongside the trench and formed in the first rear metallization level. Although an integrated circuit comprising two metallization levels on the rear surface of its substrate has been described, the present disclosure is of course not limited to this example, and it will be within the abilities of those skilled in the art to adapt it to a larger number of metallization levels.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    forming active components in a front surface of a semiconductor substrate having a thickness;
    forming, on the front surface of the semiconductor substrate, a set of front metallization levels that includes insulating portions and conductive portions formed in the insulating portions;
    forming a first hole and a second hole in a rear surface of the substrate, each of the first and second holes extending into the substrate through at least 50% of the substrate's thickness and forming respective walls and a bottom;
    covering the respective walls and bottoms with conductive material;
    filling the first and second holes with an insulating material; and
    forming a coplanar line configured to convey radio frequency signals over the rear surface of the substrate, the coplanar line having a central conductor facing the second hole and lateral conductors that are located on opposing sides of the central conductor and that are electrically coupled to the conductive material coating the walls of the second hole.

2. The method of claim 1, wherein the central conductor of the coplanar line is formed in front of said insulating material, and has a width that is smaller than a width of the second hole.

3. The method of claim 1, wherein, before covering the walls and the bottom of the first and second holes, the method including:
    coating the rear surface of the substrate, the walls, and the bottom of the first and second holes with an insulating layer; and
    removing said insulating layer from the bottom of the first and second holes.

4. The method of claim 1, wherein the second hole extends through the entire thickness of the substrate and exposes a surface of an insulating portion of said set of front metallization levels.

5. The method of claim 1, further comprising forming at least first and second rear metallization levels on the rear surface of the substrate, the first rear metallization level being formed at the same time the walls and the bottom of the first and second holes are coated with conductive material.

6. The method of claim 5, wherein the lateral conductors of the coplanar line are formed in the first rear metallization level and the central conductor of the coplanar line is formed in an upper level of the rear metallization level.

7. The method of claim 5, wherein the central conductor and the lateral conductors of the coplanar line are formed in an upper level of the rear metallization level.

8. The method of claim 1, wherein said conductive material contains copper.

9. The method of claim 1, wherein said insulating material is a polymer.

10. A method of forming an integrated circuit comprising:
    forming a hole in a semiconductor substrate having a first surface spaced apart from a second surface by a thickness, the hole being formed in the second surface of the substrate and extending through at least 50% of the thickness of the substrate and forming walls and a bottom;
    covering the walls with a conductive material;
    forming an insulating material in the hole over the conductive material; and
    forming a coplanar line that is configured to convey radio frequency signals located over the second surface of the substrate, the coplanar line including first and second lateral conductors that are located on opposing sides of a central conductor, the central conductor facing the hole, and wherein the lateral conductors of the coplanar line are electrically coupled to said conductive material that is covering the walls.

11. The method of claim 10, wherein forming the coplanar line includes:
    forming the central conductor facing said insulating material and with a width that is smaller than a width of the hole.

12. The method of claim 10, further comprising:
    forming the hole through the entire thickness of the substrate.

13. The method of claim 10, further comprising:
    forming an insulating layer in the hole and on said second surface, between the substrate and said conductive material.

14. A method of forming an integrated circuit comprising:
    forming a first hole in a semiconductor substrate having a first surface and a second opposite surface, the first hole being formed to extend through the second surface of the substrate and forming walls;
    forming a conductive material over the walls;
    forming an insulating material over the conductive material and filling the first hole;
    forming a central conductor over the second surface of the substrate and over the first hole; and
    forming first and second lateral conductors over the second surface and on opposing sides of the central conductor, the first and second lateral conductors and the central conductor having first and second opposing surfaces that are coplanar with each other and parallel with the second surface of the substrate.

15. The method of claim 14, wherein the first surface of the substrate is spaced apart from the second surface by a thickness and further comprising:
   forming the first hole extending into the substrate through at least 50% of the thickness.

16. The method of claim 14, further comprising:
   forming an insulating layer on the walls and between the substrate and the conductive material.

17. The method of claim 14, further comprising:
   electrically coupling the lateral conductors of the coplanar line to the conductive material over the walls.

18. The method of claim 14, further comprising:
   forming a second hole in the second surface of the substrate, the second hole forming walls; and
   forming a conductive material located over the walls of the second hole.

19. The method of claim 18, further comprising:
   forming active components on the front surface of the substrate; and
   electrically coupling the conductive material in the second hole to the active components.

* * * * *